(12) United States Patent
Nam et al.

(10) Patent No.: US 10,566,039 B2
(45) Date of Patent: Feb. 18, 2020

(54) MEMORY DEVICE

(71) Applicant: Samsung Electronics Co., Ltd., Suwon-si, Gyeonggi-do (KR)

(72) Inventors: Sang Wan Nam, Hwaseong-si (KR); Dong Hun Kwak, Hwaseong-si (KR); Wan Dong Kim, Seoul (KR); Chi Weon Yoon, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/043,474

(22) Filed: Jul. 24, 2018

(65) Prior Publication Data

US 2019/0214067 A1 Jul. 11, 2019

(30) Foreign Application Priority Data

Jan. 8, 2018 (KR) .......................... 10-2018-0002122

(51) Int. Cl.
| | | |
|---|---|---|
| *G11C 8/00* | (2006.01) | |
| *G11C 8/14* | (2006.01) | |
| *H01L 27/11582* | (2017.01) | |
| *G11C 16/26* | (2006.01) | |
| *G11C 16/14* | (2006.01) | |
| *G11C 16/08* | (2006.01) | |
| *H01L 27/1157* | (2017.01) | |

(52) U.S. Cl.
CPC ............... *G11C 8/14* (2013.01); *G11C 16/08* (2013.01); *G11C 16/14* (2013.01); *G11C 16/26* (2013.01); *H01L 27/1157* (2013.01); *H01L 27/11582* (2013.01)

(58) Field of Classification Search
CPC ......... G11C 16/10; G11C 16/14; G11C 16/16; G11C 16/0483; G11C 16/3418; G11C 16/349; G11C 16/08; G11C 16/32; G11C 16/3445; G11C 29/02; G11C 7/12; G11C 7/14; G11C 7/18; G11C 7/22
USPC ............ 365/185.11, 185.02, 185.05, 185.17, 365/185.29
See application file for complete search history.

(56) References Cited

U.S. PATENT DOCUMENTS

| | | | |
|---|---|---|---|
| 8,295,091 | B2 | 10/2012 | Itagaki et al. |
| 8,570,805 | B2 | 10/2013 | Lee et al. |
| 8,913,433 | B2 | 12/2014 | Kim et al. |
| 9,508,441 | B1 | 11/2016 | Nam et al. |
| 9,564,221 | B2 | 2/2017 | Jeong et al. |
| 9,601,208 | B2 | 3/2017 | Lee |
| 9,633,731 | B2 | 4/2017 | Ahn et al. |
| 2013/0088921 | A1 | 4/2013 | Nam et al. |

(Continued)

FOREIGN PATENT DOCUMENTS

KR 10-2013-0037554 A 4/2016

*Primary Examiner* — Thong Q Le
(74) *Attorney, Agent, or Firm* — Lee IP Law, P.C.

(57) ABSTRACT

A memory device includes a memory cell array including a plurality of word lines, a first string select line above the plurality of word lines, and a second string select line between the first string select line and the plurality of word lines, and a controller. During an operation of reading data of a first memory cell connected to a first word line among the plurality of word lines, the controller is to supply a first voltage to the first string select line and to supply a second voltage to the second string select line, the second voltage being greater than the first voltage.

20 Claims, 12 Drawing Sheets

(56) References Cited

U.S. PATENT DOCUMENTS

| | | | |
|---|---|---|---|
| 2015/0170749 A1* | 6/2015 | Park | G11C 16/14 365/185.05 |
| 2015/0179235 A1 | 6/2015 | Nam | |
| 2017/0169892 A1 | 6/2017 | Joo et al. | |

* cited by examiner

MEMORY DEVICE

CROSS-REFERENCE TO RELATED APPLICATION

Korean Patent Application No. 10-2018-0002122 filed on Jan. 8, 2018 in the Korean Intellectual Property Office, and entitled: "Memory Device," is incorporated by reference herein in its entirety.

BACKGROUND

1. Field

Embodiments relate to a memory device.

2. Description of the Related Art

Memory devices are devices capable of storing data or outputting data, and are used in various fields. In detail, memory devices having a vertical structure, in which memory cells storing data are stacked in a vertical direction, have been variously developed, and research into technology in which memory cells are highly integrated to increase the capacity of memory devices has been actively undertaken.

SUMMARY

According to an aspect, a memory device includes a memory cell array including a plurality of word lines, a first string select line above the plurality of word lines, and a second string select line between the first string select line and the plurality of word lines, and a controller. During an operation of reading data of a first memory cell connected to a first word line among the plurality of word lines, the controller may supply a first voltage to the first string select line and to supply a second voltage to the second string select line, the second voltage being greater than the first voltage According to an aspect, a memory device includes a plurality of memory cells arranged in a direction perpendicular to an upper surface of a substrate, at least one ground select transistor connected between the plurality of memory cells and the substrate, a first string select transistor connected to a bit line above the plurality of memory cells, a second string select transistor connected between the plurality of memory cells and the first string select transistor, and a controller. The controller may supply a first compensation voltage to at least one of the first string selector transistor, the second string select transistor, and the at least one ground select transistor, to adjust a threshold voltage thereof, while reading data of at least one of the plurality of memory cells.

According to an aspect, a memory device includes an upper memory region including a plurality of upper memory cells connected to each other in a direction perpendicular to an upper surface of a substrate, and upper dummy memory cells disposed above the plurality of upper memory cells, a lower memory region including a plurality of lower memory cells sharing a channel region together with the plurality of upper memory cells, and an intermediate dummy memory cell between the plurality of lower memory cells and the plurality of upper memory cells. A compensation voltage input to the upper dummy memory cell is greater than a compensation voltage input to the intermediate dummy memory cell, while reading data of at least one of the plurality of upper memory cells, and a compensation voltage input to the upper dummy memory cell is lower than a compensation voltage input to the intermediate dummy memory cell, while reading data of at least one of the plurality of lower memory cells.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be described with reference to the accompanying drawings.

Figure 1:
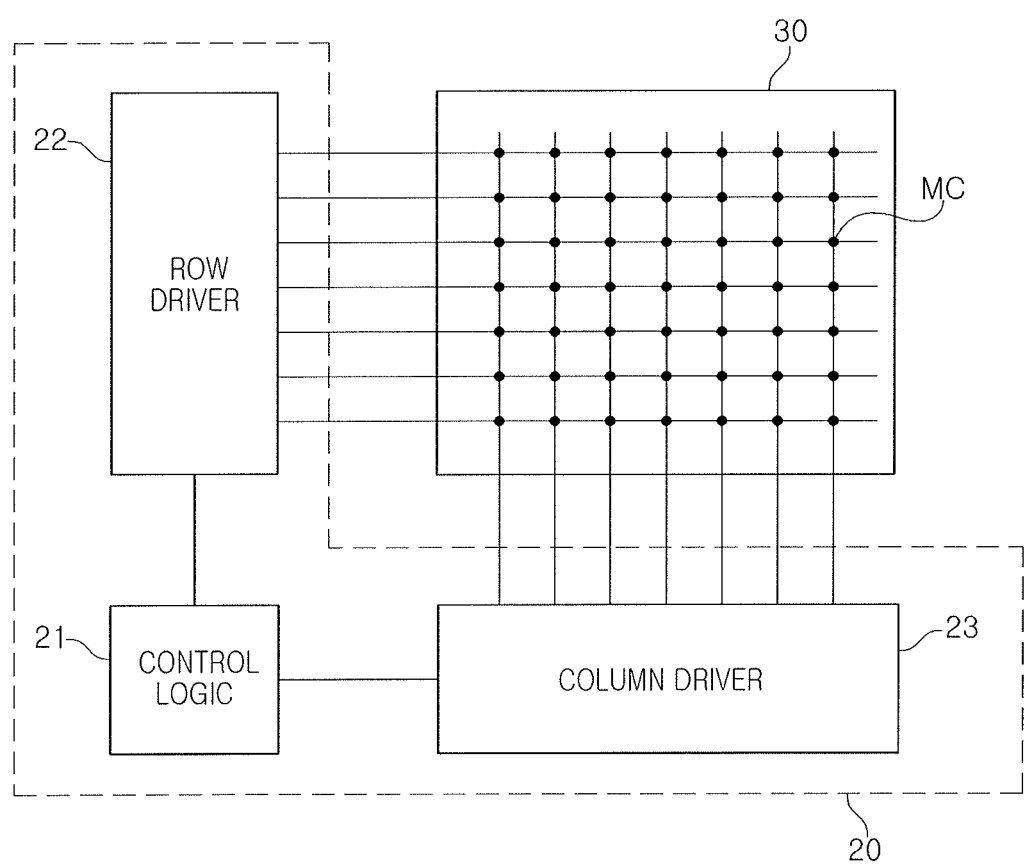
FIG. 1 illustrates a schematic block diagram of a memory device according to an exemplary embodiment.
Figure 2:
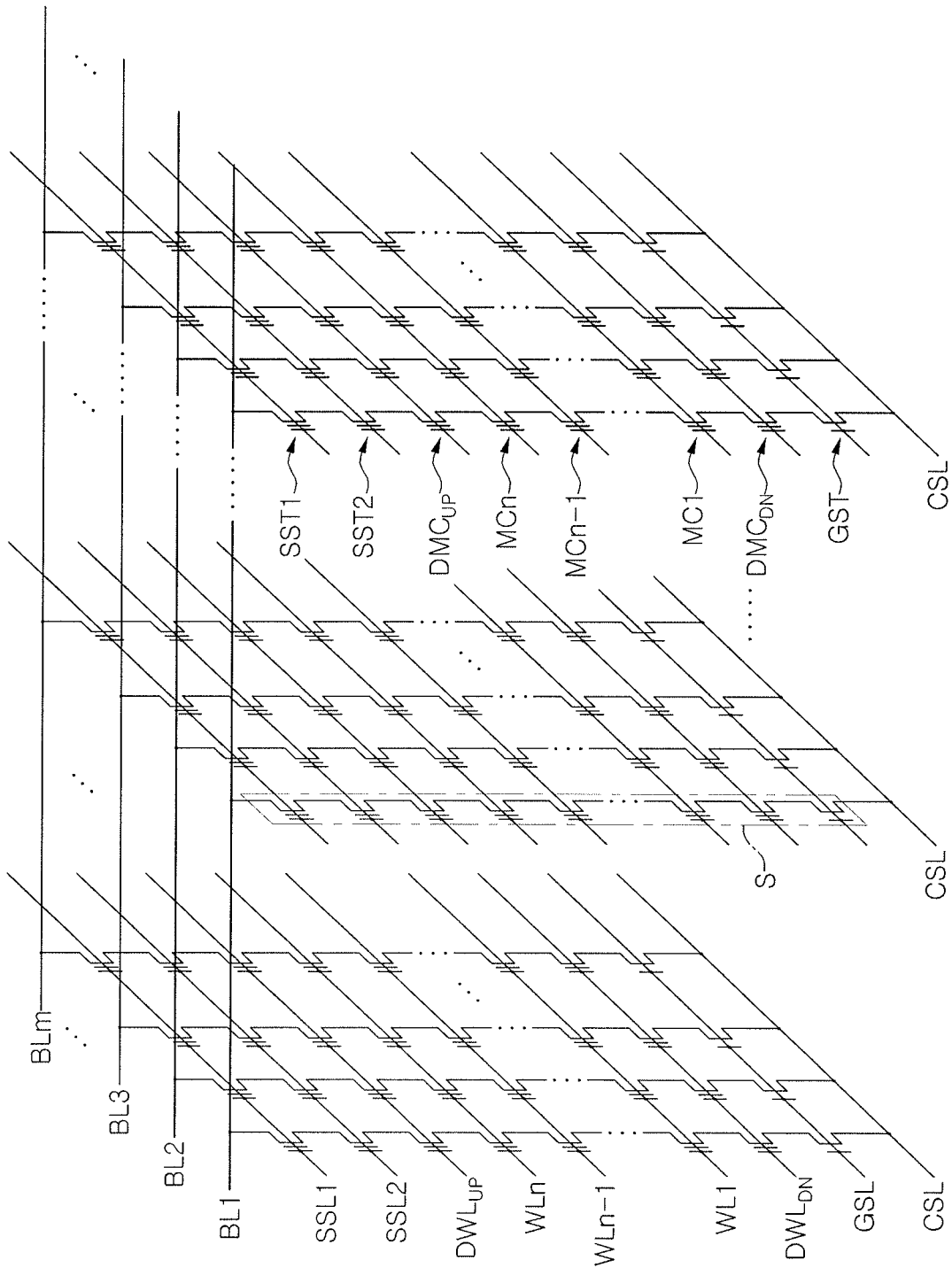
FIG. 2 illustrates a schematic circuit drawing of a memory cell array included in a memory device according to an example embodiment.

FIG. 1 is a block diagram of a memory device according to an example embodiment. FIG. 2 is a drawing of a memory cell array included in a memory device according to an example embodiment.

Referring to FIG. 1, a memory device 10 according to an example embodiment may include a memory controller 20 and a memory cell array 30. The memory controller 20 may include a control logic 21, a row driver 22, a column driver 23, and the like. The memory cell array 30 may include a plurality of memory cells MC.

In an example embodiment, the row driver 22 may be connected to the memory cells MC through word lines WL, string select lines SSL, common source lines CSL, ground select lines GSL, and the like. The column driver 23 may be connected to the memory cells MC through bit lines BL. In an example embodiment, the row driver 22 may include an address decoder circuit selecting a memory cell MC to write or read data, and the column driver 23 may include a page buffer to write data to the memory cell MC or to read data from the memory cell MC. The row driver 22 and the column driver 23 may be controlled by the control logic 21.

Referring to FIG. 2, the memory cell array 30 according to an example embodiment may include a plurality of memory cells MC. The memory cells MC may be respectively arranged on points at which a plurality of word lines WL and a plurality of bit lines BL intersect each other, e.g., form a matrix. For example, each of the memory cells MC may be connected to one of the word lines WL and one of the bit lines BL.

The plurality of memory cells MC may be connected to each other in series, thereby providing a single memory cell string MCS. The memory cell string MCS may further include a string select transistor SST and a ground select transistor GST in addition to the memory cells MC. The string select transistor SST may be connected to one of the bit lines BL above the memory cells MC in the memory cell string MCS. The ground select transistor GST may be connected to the common source line CSL below the memory cells MC.

Although the example embodiment of FIG. 2 illustrates that one memory cell string MCS includes one ground select transistor GST and two string select transistors SST1 and SST2, the number of the ground select transistor GST and the string select transistors SST1 and SST2 may be changed. In addition, the number of lower dummy word lines $DWL_{DN}$ provided between the ground select transistor GST and the word lines WL, and the number of upper dummy word lines $DWL_{UP}$ provided between the string select transistor SST and the word lines WL, may also be variously changed.

Figure 3:
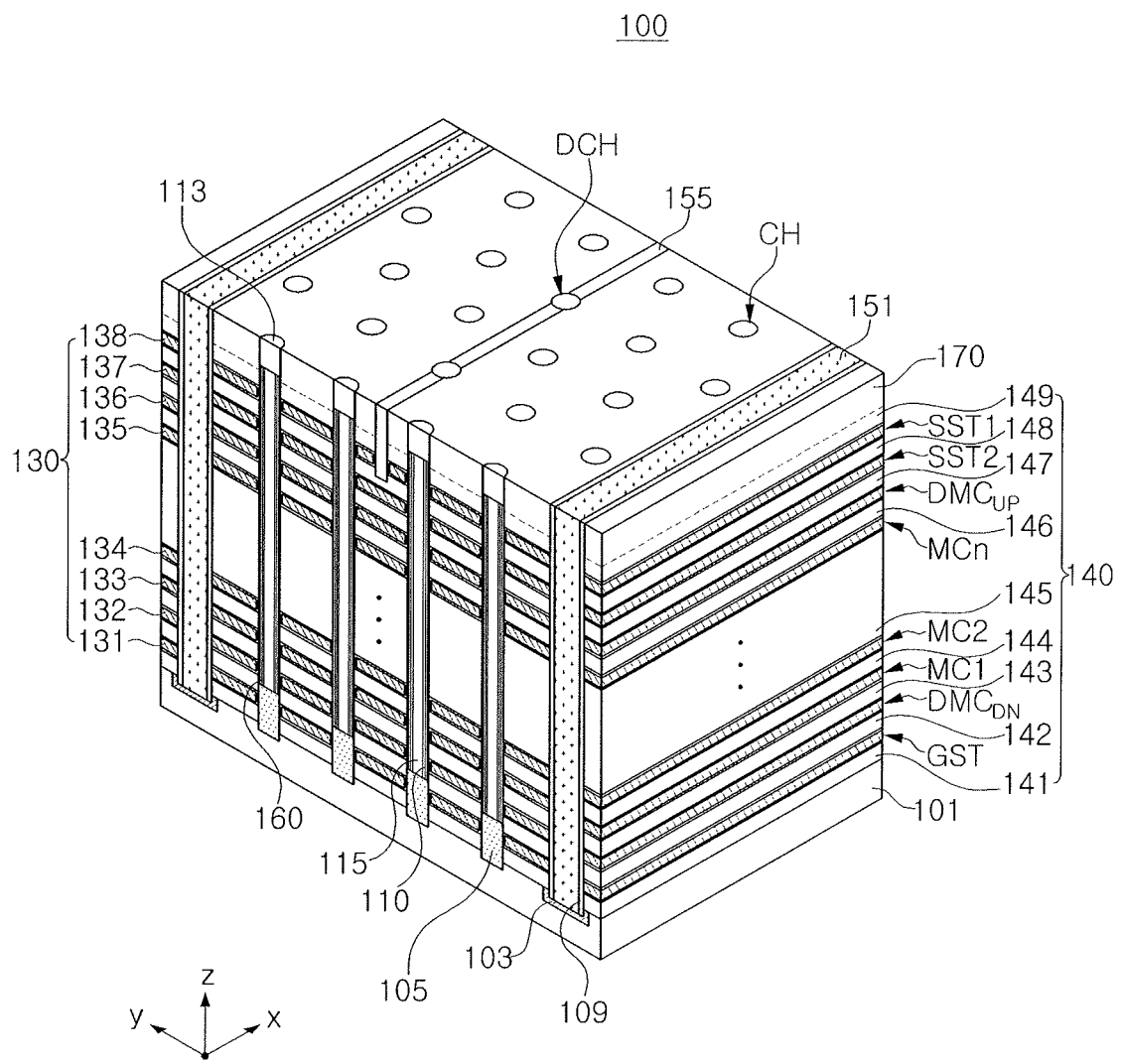
FIG. 3 illustrates a schematic drawing of a structure of a memory device according to an example embodiment.

FIG. 3 is a schematic drawing of a structure of a memory device according to an example embodiment. FIG. 3 is a partial perspective view of a memory cell array included in a memory device 100.

With reference to FIG. 3, the memory device 100 according to an example embodiment may include a substrate 101, a plurality of channel structures CH and dummy channel structures DCH, perpendicular, e.g., along a z-axis direction, to an upper surface of the substrate 101, e.g., an x-y plane in the example embodiment of FIG. 3, a plurality of gate electrode layers 131 to 138 (gate electrode layers 130) stacked on the substrate 101, e.g., along the z-axis direction, to be adjacent to the channel structures CH, and the like, and may extend in the x-y plane. The plurality of gate electrode layers 130 may be stacked alternately with a plurality of insulating layers 141 to 149 (insulating layers 140), e.g., along the z-axis direction. A portion of the plurality of gate electrode layers 130 may be divided, e.g., in the x-y plane, into a plurality of portions by an isolation insulating layer 155.

The plurality of gate electrode layers 130 may provide a ground select line 131, string select lines 137 and 138, and a plurality of word lines 132 to 136. Together with the channel structures CH, the ground select line 131 may provide the ground select transistor GST, and the string select lines 137 and 138 may provide a string select transistor SST including two string select transistors SST1 and SST2. Referring to FIG. 3, a first string select transistor SST1 may correspond to a first string select line 138, and a second string select transistor SST2 may correspond to a second string select line 137. Together with the channel structures CH, the plurality of word lines 132 to 136, between the ground select line 131 and the string select lines 137 and 138, may provide a plurality of memory cells MC1 to MCn.

The plurality of gate electrode layers 130 may be divided into a plurality of portions by a common source line 151 and a spacer 109 provided on sidewalls of the common source line 151. The common source line 151 may be formed of an conductive material, e.g., a metal, a metal compound, polysilicon or the like, and may be electrically connected to a source region 103 in the substrate 101. The source region 103 may be provided as a source region of the ground select transistor GST. The common source line 151 may be electrically isolated from the plurality of gate electrode layers 130 by the spacer 109.

The plurality of channel structures CH and dummy channel structures DCH may extend in a direction perpendicular to an upper surface of the substrate 101, e.g., in the z-axis direction in the example embodiment illustrated in FIG. 3. Each channel structure CH may include a channel region 110, an embedded insulating layer 115 filling an internal space of the channel region 110, a drain region 113 arranged on the channel region 110, a gate insulating layer 160 arranged between the channel region 110 and the gate electrode layers 130, and the like. The gate insulating layer 160 may include a tunneling layer, a charge storage layer, a blocking layer and the like, and at least a portion of the gate insulating layer 160 may be formed to have a form surrounding the gate electrode layers 130. The channel region 110 may have a columnar shape, e.g., a cylindrical shape or a prismatic shape, and may not have the embedded insulating layer 115 according to an example embodiment. In addition, the respective channel structures CH may have an inclined side surface, e.g., tapered sidewalls, narrowing toward the substrate 101, according to an aspect ratio.

The plurality of channel structures CH and dummy channel structures DCH may be separated from each other on the x-y plane. The number and the arrangement types of the plurality of channel structures CH and dummy channel structures DCH may be variously changed according to example embodiments. For example, the plurality of channel structures CH and dummy channel structures DCH may be arranged in zig-zag pattern in at least one direction. The example embodiment of FIG. 3 illustrates that the plurality of channel structures CH are symmetrical to each other with the isolation insulating layer 155 therebetween, e.g., only through the first string select line 138, and that the plurality of dummy channel structures DCH penetrate through the isolation insulating layer 155. Alternatively, the isolation insulating layer 155 may extend through the string select lines 137 and 138, and/or the plurality of channel structures CH may be asymmetrical.

The channel region 110 may be electrically connected to the substrate 101 via an epitaxial layer 105 provided therebelow. The channel region 110 may include a semiconductor material, e.g., polysilicon or monocrystalline silicon, and the semiconductor material may be undoped or may be doped with a P-type impurity or an N-type impurity. The epitaxial layer 105 may be a layer grown using a selective epitaxy growth (SEG) process. The epitaxial layer 105 may be formed to have a form recessed into the substrate 101 to a predetermined depth as illustrated in FIG. 3.

The number of the gate electrode layers 130 stacked on the substrate 101 is increased to increase the capacity of the memory device 100. As the number of the gate electrode layers 130 increases, thicknesses of the gate electrode layers 130 have been decreased to maintain a desired small thickness. As a result of this decreased thickness, interference between the plurality of memory cells MC1 to MCn, dummy memory cells $DMC_{DN}$ and $DMC_{UP}$, the ground select transistor GST, and the string select transistors SST1 and SST2 with respect to each other in a vertical direction, e.g., along the x-axis direction, may increase.

Thus, in an example embodiment, as respective thicknesses of the gate electrode layers 130 are reduced, a method, in which interference between the plurality of memory cells MC1 to MCn adjacent to each other in a vertical direction, the dummy memory cells $DMC_{DN}$ and $DMC_{UP}$, the ground select transistor GST, and the string select transistors SST1 and SST2 may be significantly reduced, is provided. In detail, in the example embodiment, various methods of compensating for influence on other devices adjacent to the dummy memory cells $DMC_{DN}$ and $DMC_{UP}$ by moving holes accumulated in charge storage layers of the dummy memory cells $DMC_{DN}$ and $DMC_{UP}$ in which only an erasing operation except for a compensation operation is repeatedly executed may be provided.

Figure 4:
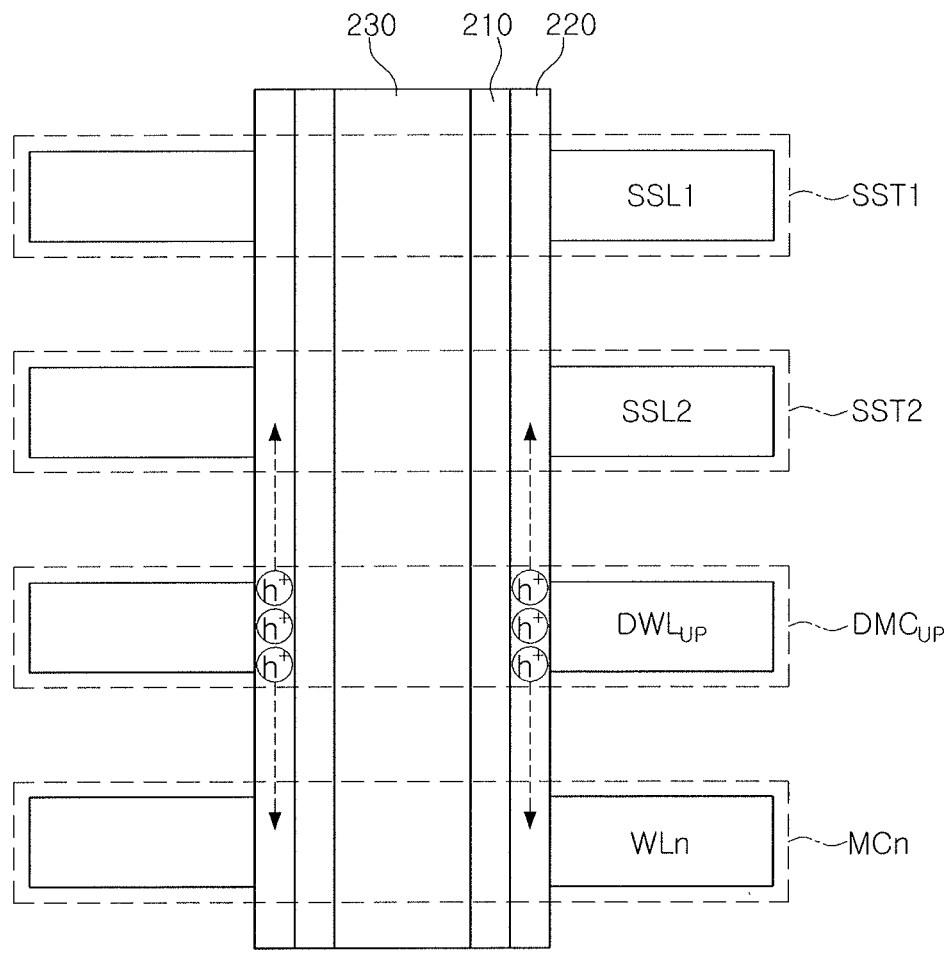
FIGS. 4 and 5 illustrate drawings of operations of a memory device according to an example embodiment.
Figure 5:
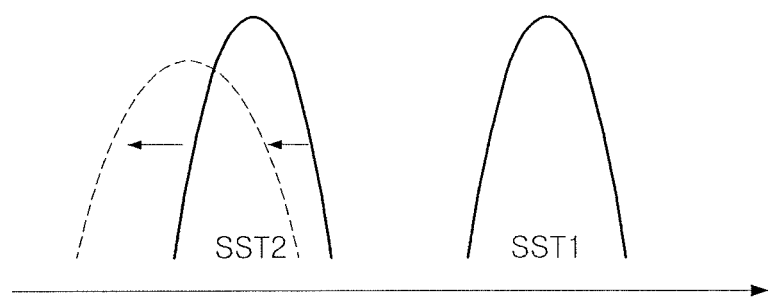

FIGS. 4 and 5 are drawings of operations of a memory device according to an example embodiment. FIG. 4 is an enlarged view of a portion of a memory device 200 according to an example embodiment. FIG. 5 illustrates changes in threshold voltages for string select transistors.

Referring to FIG. 4, the memory device 200 according to an example embodiment may include the first string select transistor SST, the second string select transistor SST2, the upper dummy memory cell $DMC_{UP}$, an nth memory cell MCn, and the like. Each of the plurality of memory cell strings included in the memory device 200 may include n memory cells.

The first string select transistor SST1, the second string select transistor SST2, the upper dummy memory cell $DMC_{UP}$, and the nth memory cell MCn may share a channel region 210. The first string select transistor SST1 may be provided by the channel region 210 and the first string select line SSL1, and the second string select transistor SST2 may be provided by the channel region 210 and the second string select line SSL2. The upper dummy memory cell $DMC_{UP}$ and the nth memory cell MCn may be connected to an upper dummy word line $DWL_{UP}$ and an nth word line WLn, respectively.

The channel region 210 may have a cylindrical shape, and an inside thereof may be filled with an embedded insulating layer 230. A gate insulating layer 220 may be formed on an external side of the channel region 210, and may include a tunneling layer, a charge storage layer, and the like. For example, when a programming operation is performed and a program voltage is input to the nth word line WLn, electrons may move through the channel region 210 to be trapped in the charge storage layer. Thus, a threshold voltage of the nth memory cell MCn may be changed. In addition, when an erasing operation is performed in the memory device 200, the electrons trapped in the charge storage layer may escape by a voltage applied to a substrate connected to the channel region 210. Thus, the threshold voltage of the nth memory cell MCn may be returned to an original state. The operation in which the electrons trapped in the charge storage layer escape by the erasing operation may also be described as an operation in which holes are trapped in the charge storage layer.

The upper dummy memory cell $DMC_{UP}$ may not be a memory cell actually storing data. Thus, a programming operation, which may be individually performed for each cell, may not be executed in the upper dummy memory cell $DMC_{UP}$. On the other hand, the erasing operation may be performed on an entire memory cell string. Therefore, the erasing operation may be performed in the upper dummy memory cell $DMC_{UP}$, and the holes may be continuously trapped in the charge storage layer of the upper dummy memory cell $DMC_{UP}$ as illustrated in FIG. 4.

The holes may move upwardly and downwardly within the charge storage layer extending vertically along an external side of the channel region 210. Holes moving to a lower portion of the upper dummy memory cell $DMC_{UP}$ may be compensated in a programming operation process for the nth memory cell MCn. Since the programming operation is not performed in the string select transistors SST1 and SST2, holes moving to an upper portion of the upper dummy memory cell $DMC_{UP}$ are not removed. Thus, threshold voltages of the string select transistors SST1 and SST2 may be unexpectedly changed. For example, the threshold voltage of the string select transistors SST1 and SST2 may be reduced by the holes moving from the upper dummy memory cell $DMC_{UP}$, as illustrated in FIG. 5. The reduction in a threshold voltage may be relatively great in the second string select transistor SST2 adjacent to the upper dummy memory cell $DMC_{UP}$, as illustrated in FIG. 5.

In an example embodiment, a compensation voltage may be input to at least one of the string select transistors SST1 and SST2 adjacent to the upper dummy memory cell $DMC_{UP}$ while the memory device 200 performs a specific operation. Thus, a variation in the threshold voltage caused by the holes moving from the upper dummy memory cell $DMC_{UP}$ may be compensated. Additionally or alternatively, when a lower dummy memory cell ($DMC_{DN}$ of FIG. 3) is between a ground select transistor (GST of FIG. 3) of the memory device 200 and a lowermost first memory cell of (MC1 of FIG. 3), the memory device may also input the compensation voltage to the ground select transistor, such that a variation in the threshold voltage of the ground select transistor may be compensated. As an example, the compensation voltage input to the string select transistors SST1 and SST2, the ground select transistor, or the like may have a voltage magnitude lower than that of a program voltage used for the programming operation for the memory cells.

Figure 6:
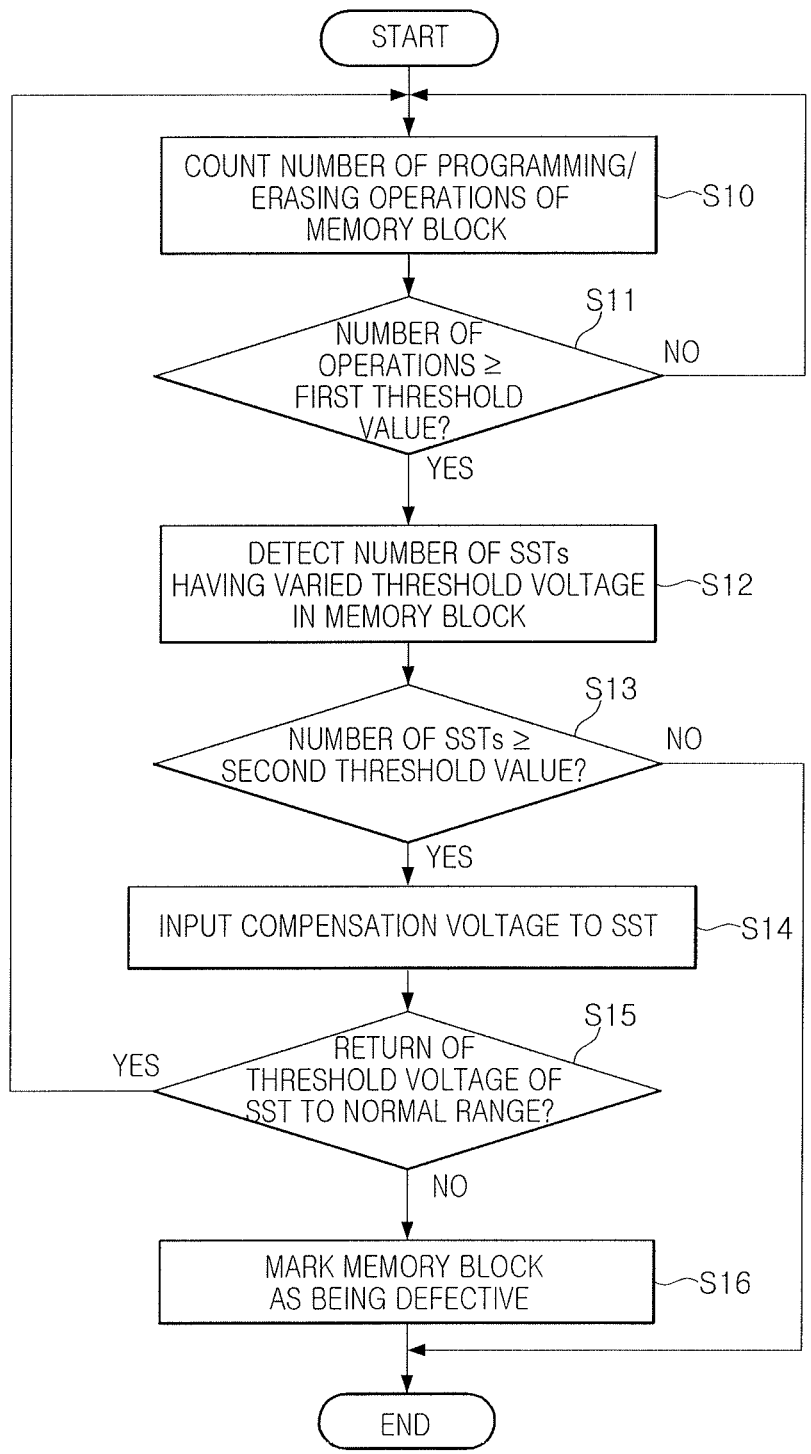
FIG. 6 illustrates a flow chart of operations of a memory device according to an example embodiment.

FIG. 6 is a flow chart provided to illustrate operations of a memory device according to an example embodiment.

Referring to FIG. 6, an operation of the memory device according to an example embodiment may begin with counting the number of repetitions of the programming/erasing operation with respect to a memory block by a controller of the memory device (S10). For example, the memory block may be a region in which the erasing operation is performed, and one memory block may include a plurality of memory cell strings.

As described above, in dummy memory cells, only an erasing operation, except for a compensation operation, may be repeatedly performed. As the erasing operation is repeated, holes may be accumulated in a charge storage layer of the dummy memory cells. The holes accumulated in the dummy memory cells may move within the charge storage layer extending along a channel region, to cause a variation in threshold voltages of string select transistors or a ground select transistor adjacent to the dummy memory cells.

The controller of the memory device may compare the number of operations counted in S10, with a first threshold value, in S11. As a result of the comparison in S11, e.g., when the counted number of operations is smaller than the first threshold value, the controller may continue to count the number of programming/erasing operations. When the counted number of operations is greater than or equal to the first threshold value, in the comparison result of S11, the controller may detect the number of string select transistors having a varied threshold voltage, among the plurality of string select transistors included in the memory block, in S12.

The controller may compare the number of string select transistors detected in S12, with a second threshold value, in S13. As a result of the comparison in S13, for example, when the number of string select transistors having a varied threshold voltage is smaller than the second threshold value, the controller may not perform a separate compensation operation for the memory device. On the other hand, for example, when it is determined that the number of the string select transistors having a varied threshold voltage is greater than or equal to the second threshold value, a compensation voltage may be input to the string select transistors SST having the varied threshold voltage, in S14.

In an example embodiment, the compensation voltage input to the string select transistor in S14 may also have a magnitude smaller than that of a program voltage input to a memory cell to be programmed in a general programming operation. In addition, the operation S14 may be executed together with at least one operation among a reading operation of, e.g., reading data of at least one of the memory cells included in the memory block, an erase verifying operation, and a program verifying operation. For example, in an example embodiment, since a separate operation time is not required to compensate for a variation of the threshold voltage of the string select transistor, the efficiency of operations of the memory device may be improved.

When the operation S14 is completed, the controller may determine whether a threshold voltage of the string select transistor to which the compensation voltage has been input has returned to a normal range, in S15. In an example, the normal range may be a range of a threshold voltage initially set with respect to the string select transistor. When it is determined that the threshold voltage of the string select transistor, to which the compensation voltage has been input, is returned to the normal range, in S15, the controller may re-count the number of programming/erasing operations for the memory block in S10.

On the other hand, when the threshold voltage of the string select transistor does not return to the normal range, even after the compensation voltage has been input, the controller may mark the memory block as being defective in S16. The memory block marked as being defective by the controller may not be selected for the programming operation, or the like, executed by the controller thereafter.

Additionally or alternatively, the operations set forth in FIG. 6 may be used to monitor and compensate the gate select transistor GST.

Figure 7:
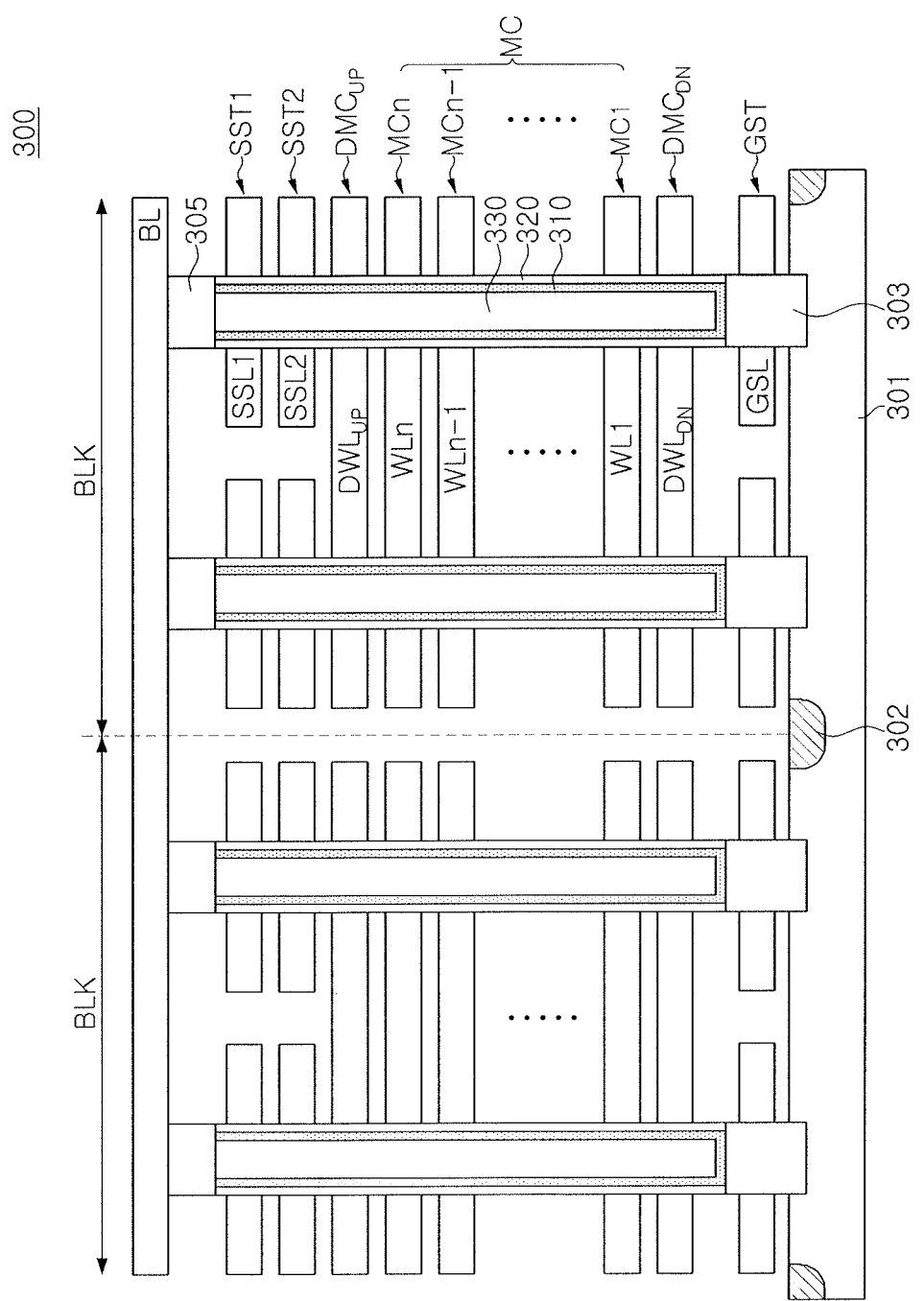
FIGS. 7 to 9 illustrate drawings of operations of a memory device according to an example embodiment.
Figure 8:
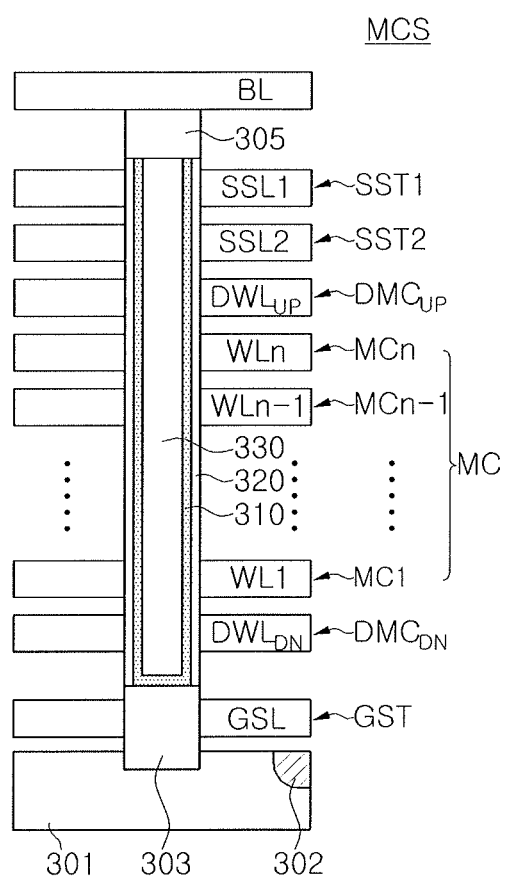
Figure 9:
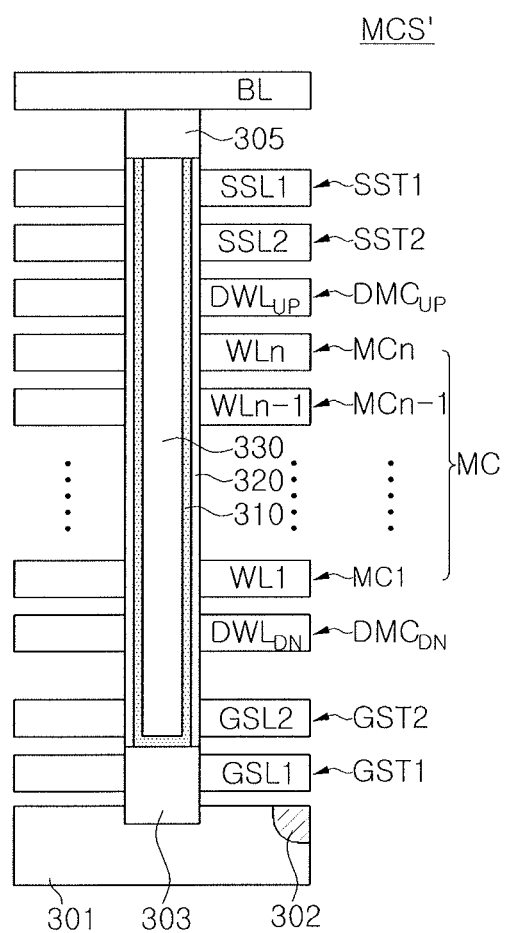

FIGS. 7 to 9 are views of operations of a memory device according to an example embodiment.

Referring to FIG. 7, a memory device 300 according to an example embodiment may include a plurality of memory blocks BLK. In an example, each of the memory blocks BLK may be a region unit in which an erasing operation is performed. Each of the memory blocks BLK may include a plurality of memory cell strings, and each of the memory cell strings may be defined, based on a channel region 310. An embedded insulating layer 330 may be disposed in the channel region 310, and a gate insulating layer 320 including a charge storage layer may be disposed outside of the channel region 310. An epitaxial layer 303 may be formed between the channel region 310 and a substrate 301.

Then, with reference to FIG. 8, a single memory cell string MCS may include a first string select transistor SST1, a second string select transistor SST2, an upper dummy memory cell $DMC_{UP}$, a plurality of memory cells MC, a lower dummy memory cell $DMC_{DN}$, a ground select transistor GST, and the like. The first string select transistor SST1 may be connected to a bit line BL above the memory cell string, through a drain region 305, and the ground select transistor GST may be connected to a source region 302 via the substrate 301.

In an example, a threshold voltage of the first string select transistor SST1 may be greater than a threshold voltage of the second string select transistor SST2. Thus, during a programming operation, a potential, formed as the channel region 310 is boosted, may have linear characteristics. In the example embodiment illustrated in FIG. 8, a bias condition of a voltage for execution of the programming operation may be as shown in Table 1 below. The bias condition in Table 1 may be a bias condition for a memory cell string MCS including a program memory cell to be programmed. VDD other than 0V may be input to a bit line of the memory cell string MCS including the program memory cell and a bit line of other memory cell strings MCS sharing a plurality of word lines WL1 to WLn. In the bias condition shown in Table 1, a pass voltage $V_{PASS}$ may be lower than a program voltage $V_{PGM}$.

TABLE 1

| BL | SSL1 | SSL2 | $DWL_{UP}$ | $WL_{UNSEL}$ | $WL_{SEL}$ | $DWL_{DN}$ | GSL | CSL |
|---|---|---|---|---|---|---|---|---|
| 0 | VDD | VDD | $V_{PASS}$ | $V_{PASS}$ | $V_{PGM}$ | $V_{PASS}$ | 0 | VDD |

On the other hand, a bias condition of a voltage to execute a reading operation with respect to the memory cell string MCS may be as shown in Table 2 below. Pass voltages $V_{PASS}$ indicated in Table 1 and Table 2 may have different values. According to an example embodiment, an erase voltage $V_{ERS}$ may also be input to the bit line BL and string select lines SSL1 and SSL2, unlike Table 2.

TABLE 2

| BL | SSL1 | SSL2 | $DWL_{UP}$ | $WL_{UNSEL}$ | $DWL_{DN}$ | GSL | CSL | Substrate |
|---|---|---|---|---|---|---|---|---|
| Float | Float | Float | $V_{PASS}$ | 0 | $V_{PASS}$ | $V_{ERS}$ | $V_{ERS}$ | $V_{ERS}$ |

Referring to Table 1 and Table 2, the program voltage $V_{PGM}$ may be input to the word lines WL1 to WLn by the operation of the memory device, and thus, electrons may be trapped in charge storage layers of a plurality of memory cells MC. On the other hand, the program voltage $V_{PGM}$ is not input to dummy word lines $DWL_{UP}$ and $DWL_{DN}$. Thus, only an erasing operation may be repeatedly performed in the dummy memory cells $DMC_{UP}$ and $DMC_{DN}$, such that holes may be repeatedly trapped and accumulated in charge storage layers of the dummy memory cells $DMC_{UP}$ and $DMC_{DN}$, which may cause degradation in characteristics of other memory cells MC, string select transistors SST1 and SST2, or the ground select transistor GST, adjacent to the dummy memory cells $DMC_{UP}$ and $DMC_{DN}$.

In an example embodiment, a method for compensating for characteristic deterioration due to a variation of threshold voltages, or the like, of a plurality of memory cells MC, string select transistors SST1 and SST2, and a ground select transistor GST is provided. According to an example embodiment, during execution of at least one of a reading operation, an erase verifying operation, and a program verifying operation, a soft program may be executed with respect to a device having been determined to have a varied threshold voltage, thereby compensating for a variation of threshold voltage. For example, during a reading operation of reading data from one of the plurality of memory cells MC, a voltage bias condition according to an example embodiment may be as shown in Table 3 below.

TABLE 3

| SSL1 | SSL2 | $DWL_{UP}$ | $WL_{UNSEL}$ | $WL_{SEL}$ | $DWL_{DN}$ | GSL | CSL |
|---|---|---|---|---|---|---|---|
| $V_{PASS}$ | $V_{SPGM}$ | $V_{PASS}$ | $V_{PASS}$ | $V_{READ}$ | $V_{PASS}$ | $V_{PASS}$ | 0 |

Referring to Table 3, a compensation voltage, e.g., a soft program voltage $V_{SPGM}$ to execute a soft programming operation, may be input to a second string select line, and the soft program voltage $V_{SPGM}$ may have a value higher than that of the pass voltage $V_{PASS}$. A soft program operation in which electrons are trapped in the charge storage layer of the second string select transistor SST2 may occur while the controller reads data from a specific memory cell. Thus, holes accumulated in the upper dummy memory cell $DMC_{UP}$ and moved to the second string select transistor SST2 by the erasing operation may be offset by the soft programming operation, and a decrease of a threshold voltage of the second string select transistor SST2 may be compensated.

In an example embodiment, the second string select transistor SST2, relatively adjacent, e.g., closer, to the upper dummy memory cell $DMC_{UP}$, may be more affected than the first string select transistor SST1, by the accumulated holes. The controller may input a compensation voltage to the second string select line SSL2, that is greater than a compensation voltage input to the first string select line SSL1, during the reading operation, thereby effectively offsetting the influence by the accumulated holes.

Further, in an example embodiment, in performing a reading operation, a compensation voltage for execution of a soft programming operation may also be input to the upper dummy word line $DWL_{UP}$ and the lower dummy word line $DWL_{DN}$. For example, the controller may input a compensation voltage, e.g., a dummy voltage, to the lower dummy word line $DWL_{DN}$, having a magnitude smaller than that of a compensation voltage, e.g., a dummy voltage, input to the upper dummy word line $DWL_{UP}$. As a thickness of the gate insulating layer 320 decreases toward the substrate 301, electrons may more easily be trapped in the charge storage layer in the lower dummy memory cell $DMC_{DN}$ than in the upper dummy memory cell $DMC_{UP}$. Thus, the controller may input a compensation voltage to the lower dummy word line $DWL_{DN}$, having a magnitude smaller than that of a compensation voltage input to the upper dummy word line $DWL_{UP}$, in consideration of the characteristics as above.

Alternatively, compensating for an influence by the holes accumulated in the dummy memory cells $DMC_{UP}$ and $DMC_{DN}$ may also be executed together with the erase verifying operation or the program verifying operation. As an example, the bias condition of a voltage for execution of the erase verifying operation may be as shown in Table 3, described above. The erase verifying operation may be performed a plurality of times.

In an example embodiment, for example, when a first erase verifying operation and a second erase verifying operation are sequentially performed, the controller may only input a compensation voltage to the second string select line SSL2, in at least one of the first erase verifying operation and the second erase verifying operation. On the other hand, the controller may also input a compensation voltage to the first string select line SSL1 and the dummy word lines $DWL_{UP}$ and $DWL_{DN}$, in the other operation among the first and second erase verifying operations.

For example, in the memory device according to an example embodiment, a first word line voltage may be input to a selected memory cell, and a second word line voltage may be input to unselected remaining memory cells, to read data from any one of the plurality of memory cells MC. In an example embodiment, the first word line voltage may be smaller than the second word line voltage.

In addition, during reading data from one of the plurality of memory cells MC, a compensation voltage greater than the second word line voltage may be input to at least one of the string select lines SSL1 and SSL2 and the dummy word lines $DWL_{UP}$ and $DWL_{DN}$, such that a soft programming operation may be executed in at least one of the string select transistors SST1 and SST2 and the dummy memory cells $DMC_{UP}$ and $DMC_{DN}$. Thus, a variation of threshold voltage occurring as holes are accumulated in the charge storage layer of the string select transistors SST1 and SST2 and the dummy memory cells $DMC_{UP}$ and $DMC_{DN}$, and an error in an operation occurring thereby, may be effectively compensated for, and reliability of the memory device may be improved thereby.

Then, referring to FIG. 9, a memory cell string MCS' according to an example embodiment may have a structure similar to that of the memory cell string MCS according to the example embodiment described above with reference to FIG. 8, while in the example embodiment illustrated in FIG. 9, the memory cell string MCS' may include a first ground select transistor GST1 and a second ground select transistor GST2. The first ground select transistor GST1 may be provided by an epitaxial layer 303, while the second ground select transistor GST2 may include a channel region 310 and a gate insulating layer 320. For example, the first ground select transistor GST1 and the second ground select transistor GST2 may have different structures.

In an example embodiment, the first and second ground select transistors GST1 and GST2 may have different threshold voltages. For example, a threshold voltage of the first ground select transistor GST1 may be greater than a threshold voltage of the second ground select transistor GST2, such that the channel region 310 may be boosted in a programming operation, to uniformly form a potential.

On the other hand, since the second ground select transistor GST2 includes the gate insulating layer 320, a threshold voltage of the second ground select transistor GST2 may be reduced by holes accumulated in a lower dummy memory cell $DMC_{DN}$ and moved within a charge storage layer of the gate insulating layer 320. In the example embodiment, voltages having different magnitudes may be input to a first ground select line GSL1 and a second ground select line GSL2 in a reading operation, an erase verifying operation, a program verifying operation, or the like, thereby compensating for a variation of a threshold voltage of the second ground select transistor GST2. A bias condition of the voltage according to above example embodiment may be as shown in Table 4 below. A controller of a memory device may also input a compensation voltage, e.g., a soft program voltage $V_{SPGM}$ for execution of a soft program, to dummy word lines $DWL_{UP}$ and $DWL_{DN}$, or a first string select line SSL1, as required, unlike the bias condition shown in Table 4.

TABLE 4

| SSL1 | SSL2 | $DWL_{UP}$ | $WL_{UNSEL}$ | $WL_{SEL}$ | $DWL_{DN}$ | GSL2 | GSL1 | CSL |
|---|---|---|---|---|---|---|---|---|
| $V_{PASS}$ | $V_{SPGM}$ | $V_{PASS}$ | $V_{PASS}$ | $V_{READ}$ | $V_{PASS}$ | $V_{SPGM}$ | $V_{PASS}$ | 0 |

In an example embodiment described with reference to Table 4, soft program voltages $V_{SPGM}$ input to respective lines may be different from each other. In an example, a soft program voltage $V_{SPGM}$ input to the second string select line SSL2 may be greater than a soft program voltage $V_{SPGM}$ input to the dummy word lines $DWL_{UP}$ and $DWL_{DN}$ or the second ground select line GSL2, which may result from a thickness of the gate insulating layer 320 adjacent to an inside of the second string select line SSL2, being greater than a thickness of the gate insulating layer 320 adjacent to insides of the dummy word lines $DWL_{UP}$ and $DWL_{DN}$ or the second ground select line GSL2.

In an example embodiment, the operations described with reference to FIGS. 7 to 9 may be executed, when the number of programming/erasing operations of the memory block BLK is equal to a first threshold value or more, and the number of string select transistors, of which threshold voltages deviate from a normal range, among the string select transistors SST1 and SST2 included in the memory block BLK, is equal to a second threshold value or more. For example, when string select transistors SST1 and SST2 having a threshold voltage, not returned to a normal range, are present in a relevant memory block BLK, even after the compensation has been performed with respect to at least one of the string select lines SSL1 and SSL2, the controller may mark the relevant memory block BLK as being defective.

Figure 10:
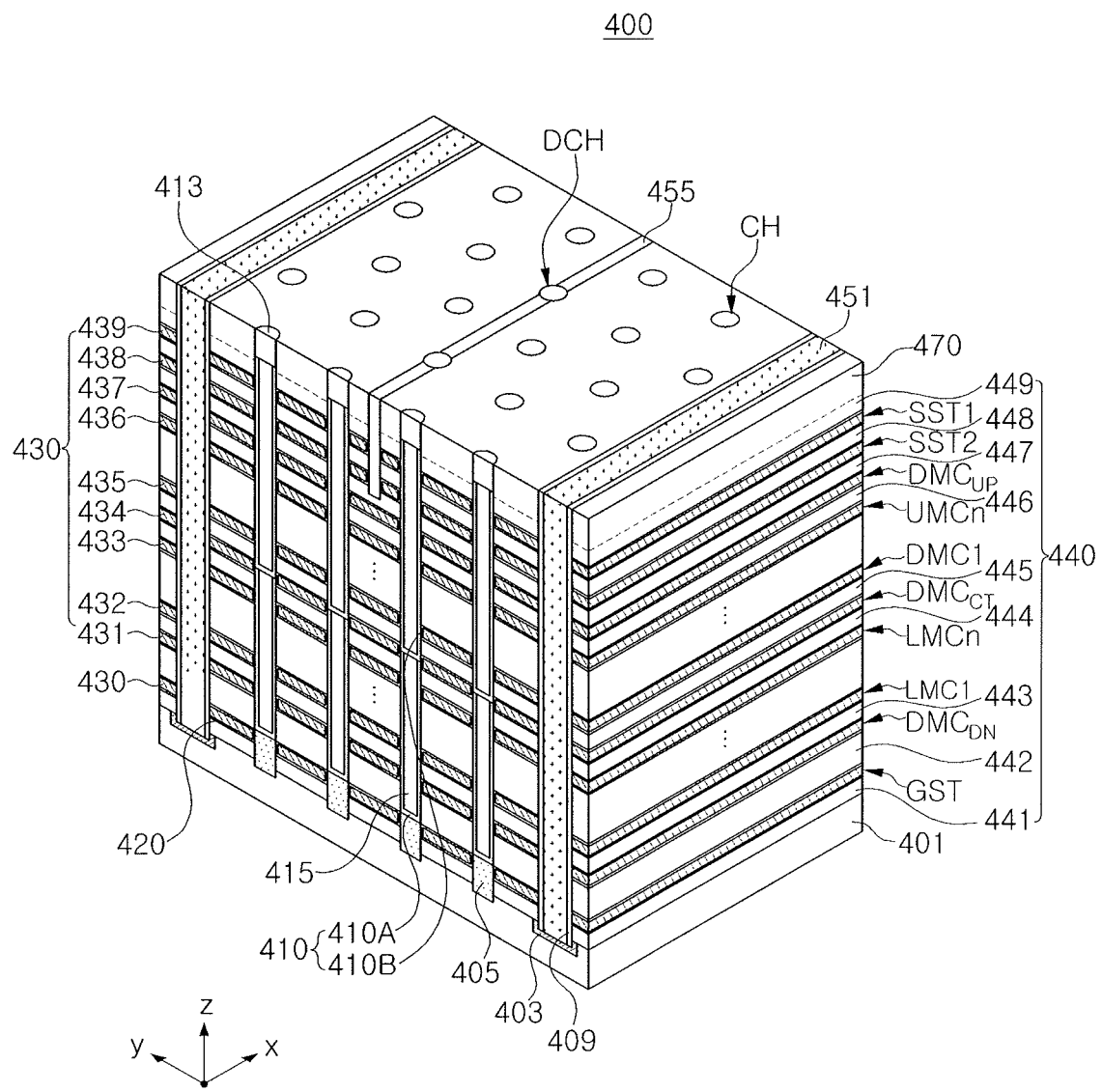
FIG. 10 illustrates a schematic drawing of a structure of a memory device according to an example embodiment.

FIG. 10 is a schematic view of a structure of a memory device according to an example embodiment. FIG. 10 is a perspective view of a portion of a memory cell array included in a memory device 400.

Referring to FIG. 10, a memory device 400 according to an example embodiment may include a substrate 401, a plurality of channel structures CH and of dummy channel structures DCH, perpendicular to an upper surface of the substrate 401, for example, an x-y plane of the example embodiment illustrated in FIG. 10, a plurality of gate electrode layers 431 to 439 (gate electrode layers 430) stacked on the substrate 401 to be adjacent to the channel structures CH, and the like. The plurality of gate electrode layers 430 may be stacked alternately with a plurality of insulating layers 441 to 449 (insulating layers 440), and at least portions 438 and 439 of the gate electrode layers may be divided into a plurality of portions by an isolation insulating layer 455.

In the example embodiment illustrated in FIG. 10, a channel region 410 may include a lower channel region 410A and an upper channel region 410B. The lower channel region 410A may be connected to the upper channel region 410B. A gate electrode layer 434 adjacent to a boundary between the lower channel region 410A and the upper channel region 410B may provide an intermediate dummy memory cell $DMC_{CT}$. In dummy memory cells $DMC_{UP}$, $DMC_{CT}$ and $DMC_{DN}$, a programming operation may not be performed in a manner different from other memory cells MC1 to MCn. As the channel region 410 is formed to be divided into the lower channel region 410A and the upper channel region 410B, a process problem due to an increase in the number of stages of the memory device 400 may be prevented from occurring.

Upper memory cells UMC1 to UMCn may be above the intermediate dummy memory cell $DMC_{CT}$, and lower memory cells LMC1 to LMCn may be below the intermediate dummy memory cell $DMC_{CT}$. The upper memory cells UMC1 to UMCn may be provided by a plurality of upper word lines sharing the upper channel region 410B, and the lower memory cells LMC1 to LMCn may be provided by a plurality of lower word lines sharing the lower channel region 410A.

Other components, except for the channel region 410 and the intermediate dummy memory cell $DMC_{CT}$, may be similar to those of the memory device 100 illustrated in FIG. 3. The gate electrode layers 430 may be divided into a plurality of regions by a common source line 451 and a spacer 409, and the common source line 451 may be connected to a source region 403 formed in the substrate 401. A gate insulating layer 420 may be formed between the channel region 410 and the gate electrode layers 430. The gate insulating layer 420 may include a plurality of layers, such as a blocking layer, a charge storage layer, a tunneling layer, and the like, at least one of which may be dividedly formed on an external surface of the channel region 410 and respective external surfaces of the gate electrode layers 430.

Figure 11:
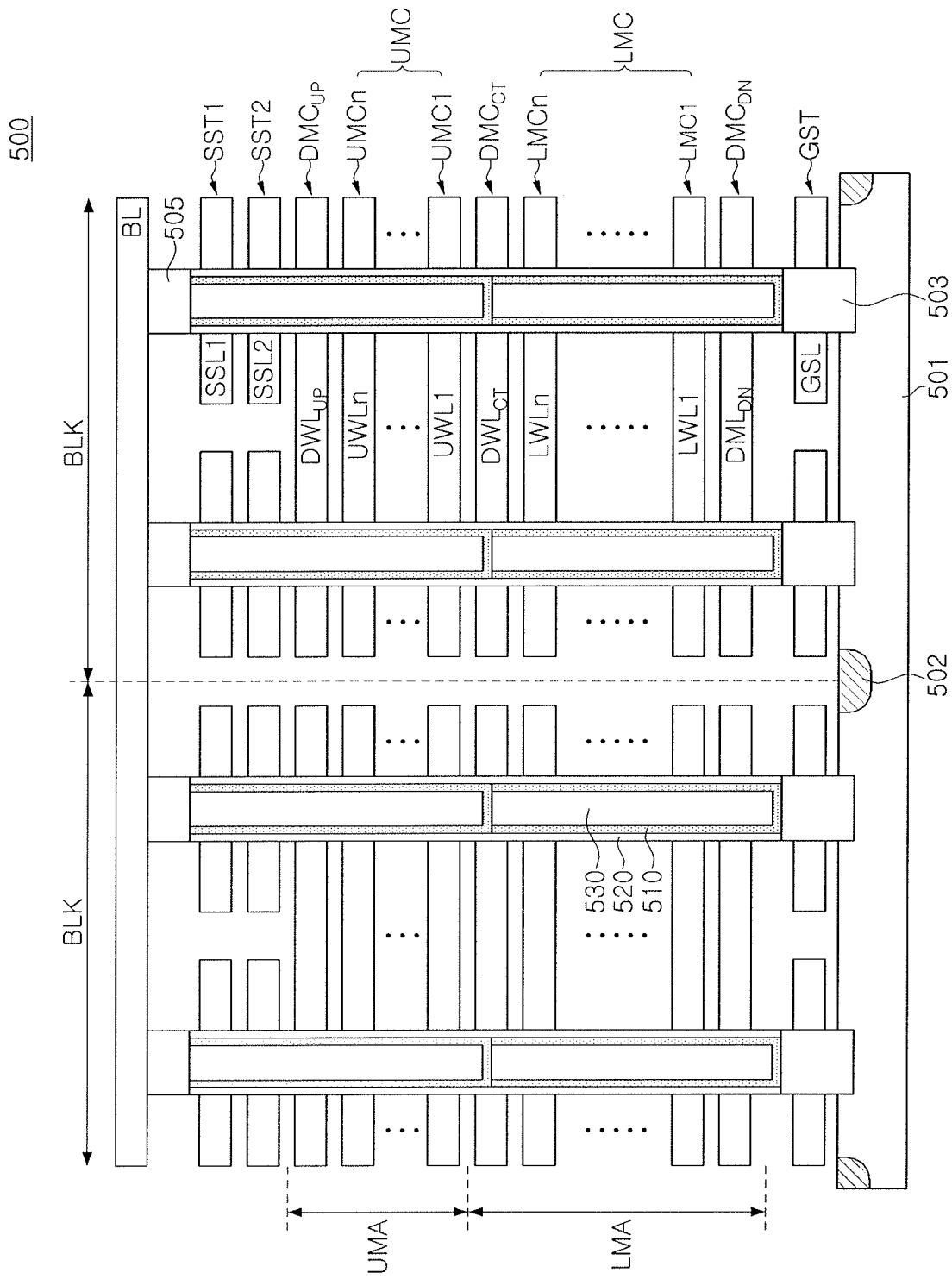
FIGS. 11 and 12 illustrate drawings of operations of a memory device according to an example embodiment.
Figure 12:
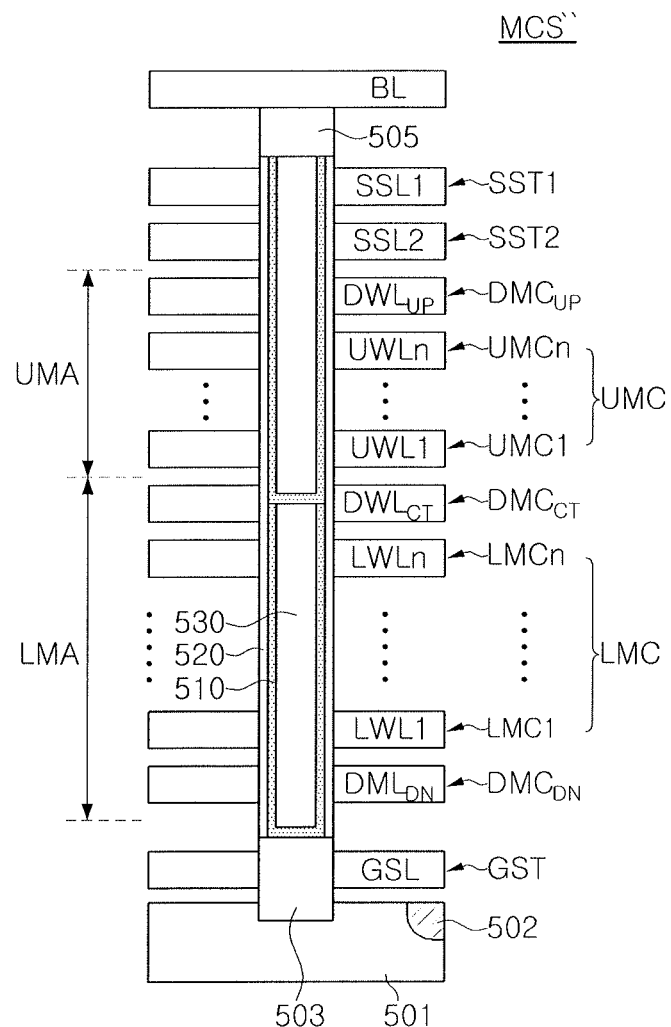

FIGS. 11 and 12 are diagrams of operations of a memory device according to an example embodiment.

Referring to FIG. 11, a memory device 500 according to an example embodiment may include a plurality of memory blocks BLK. Each of the memory blocks BLK may include a plurality of memory cell strings, and each of the memory cell strings may be defined, based on a channel region 510. An embedded insulating layer 530 may be in the channel region 510, and a gate electrode layer 520 including a charge storage layer may be outside of the channel region 510. An epitaxial layer 503 may be formed between the channel region 510 and a substrate 501.

In the example embodiment of FIGS. 11 and 12, each of the memory cell strings may include upper memory cells UMC1 to UMCn (UMC) and lower memory cells LMC1 to LMCn (LMC), divided based on an intermediate dummy memory cell $DMC_{CT}$. Although the example embodiment in FIGS. 11 and 12 illustrates that the numbers of the upper memory cells UMC and the lower memory cells LMC are the same as each other, the number of the upper memory cells UMC and the number of the lower memory cells LMC may be different. A plurality of the upper memory cells UMC may be included in an upper memory region UMA, and a plurality of the lower memory cells LMC may be included in a lower memory region LMA.

An upper dummy memory cell $DMC_{UP}$ may be provided between the upper memory cells UMC and string select transistors SST1 and SST2, and a lower dummy memory cell $DMC_{DN}$ may be provided between the lower memory cells LMC and a ground select transistor GST. As described above, holes may be accumulated in a charge storage layer of the upper dummy memory cell $DMC_{UP}$ due to a repeatedly performed erasing operation, and the accumulated holes may move within the charge storage layer to lower threshold voltages of the string select transistors SST1 and SST2. In an example embodiment, by supplying a compensation voltage to at least one of string select lines SSL1 and SSL2 while performing a reading operation, an erasing verifying operation, or a program verifying operation or the like, the threshold voltages reduced by the accumulated holes may be restored.

On the other hand, holes may also be accumulated in a charge storage layer of the intermediate dummy memory cell $DMC_{CT}$ by the repeatedly executed erasing operation. The holes accumulated in the charge storage layer of the intermediate dummy memory cell $DMC_{CT}$ may move toward a first upper memory cell UMC1 or an nth lower memory cell LMCn, to deteriorate characteristics of the first upper memory cell UMC1 or the nth lower memory cell LMCn. In an example embodiment, by inputting the compensation voltage, e.g., a dummy voltage, to the intermediate dummy word line $DWL_{CT}$ while a reading operation, an erase verifying operation, a program verifying operation or the like is performed, the holes accumulated in the charge storage layer of the intermediate dummy memory cell $DMC_{CT}$ may be offset. In an example, the controller of the memory device may input a compensation voltage to the intermediate dummy word line $DWL_{CT}$ when performing a reading operation, an erase verifying operation, a program verifying operation or the like with respect to any one of a plurality of lower memory cells LMC.

While the controller reads data from one of the plurality of upper memory cells UMC, the controller may input a voltage to the upper dummy word line $DWL_{UP}$, the voltage being greater than a voltage input to the intermediate dummy word line $DWL_{CT}$. In an example, the voltage input to the intermediate dummy word line $DWL_{CT}$ may be a pass voltage, input to remaining memory cells, other than a memory cell reading data. On the other hand, while reading data from any one of the plurality of lower memory cells LMC, the controller may input a voltage to the upper dummy word line $DWL_{UP}$, the voltage being smaller than a voltage input to the intermediate dummy word line $DWL_{CT}$. In this case, the pass voltage may be input to the upper dummy word line $DWL_{UP}$.

In an example embodiment, voltage bias conditions for execution of a data reading operation, a data erase verifying operation, and the like in any one of the plurality of upper memory cells UMC may be as shown in Table 5 below.

TABLE 5

| SSL1 | SSL2 | $DWL_{UP}$ | $UWL_{UNSEL}$ | $UWL_{SEL}$ | $DWL_{CT}$ | LWL | $DWL_{DN}$ | GSL | CSL |
|---|---|---|---|---|---|---|---|---|---|
| $V_{PASS}$ | $V_{SPGM}$ | $V_{SPGM}$ | $V_{PASS}$ | $V_{READ}$ | $V_{PASS}$ | $V_{PASS}$ | $V_{PASS}$ | $V_{PASS}$ | 0 |

In addition, in an example embodiment, voltage bias conditions for execution of the reading operation, the erase verifying operation, and the like in any one of the plurality of lower memory cells LMC may be as shown in Table 6 below

TABLE 6

| SSL1 | SSL2 | $DWL_{UP}$ | UWL | $DWL_{CT}$ | $LWL_{UNSEL}$ | $LWL_{SEL}$ | $DWL_{DN}$ | GSL | CSL |
|---|---|---|---|---|---|---|---|---|---|
| $V_{PASS}$ | $V_{SPGM}$ | $V_{PASS}$ | $V_{PASS}$ | $V_{SPGM}$ | $V_{PASS}$ | $V_{READ}$ | $V_{PASS}$ | $V_{PASS}$ | 0 |

In Tables 5 and 6, the controller may also input the soft program voltage $V_{SPGM}$ to the lower dummy word line $DWL_{DN}$. In an example embodiment, a soft program voltage $V_{SPGM}$ input to the second string select line SSL2 may be greater than the soft program voltage $V_{SPGM}$ input to the upper dummy word line $DWL_{UP}$, the intermediate dummy word line $DWL_{CT}$, or the like. In addition, the soft program voltage $V_{SPGM}$ input to the upper dummy word line $DWL_{UP}$ may be greater than the soft program voltage $V_{SPGM}$ input to the intermediate dummy word line $DWL_{CT}$, which may result from thicknesses of the channel region 510 and the gate electrode layer 520, being reduced toward the substrate 501 in a memory cell string MCS". For example, holes accumulated in the charge storage layer may be removed, even with a soft program voltage $V_{SPGM}$ having a relatively low magnitude, toward the substrate 501.

In an example embodiment, the operations described with reference to FIGS. 11 to 12 may be executed, when the number of programming/erasing operations of the memory block BLK is equal to a first threshold value or more, and the number of string select transistors, of which threshold voltages deviate from a normal range, among the string select transistors SST1 and SST2 included in the memory block BLK, is equal to a second threshold value or more. For example, when string select transistors SST1 and SST2 having a threshold voltage, not returned to a normal range, are present in a relevant memory block BLK, even after the soft program voltage $V_{SPGM}$ to at least one of the string select lines SSL1 and SSL2, the controller may mark the relevant memory block BLK as being defective.

Figure 13:
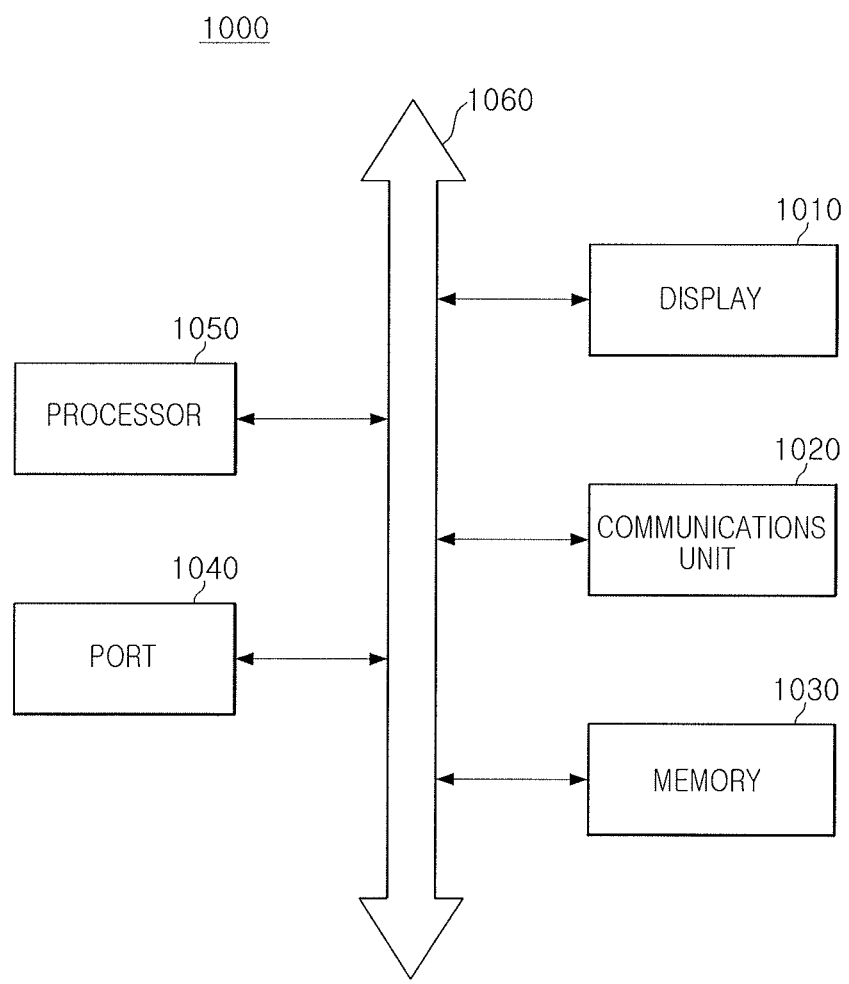
FIG. 13 illustrates a schematic diagram of an electronic device including a memory device according to an example embodiment.

FIG. 13 is a schematic diagram of an electronic device including a memory device according to an example embodiment.

Referring to FIG. 13, an electronic device 1000 according to an example embodiment may include a display 1010, a communications unit 1020, a memory 1030, a port 1040, a processor 1050, and the like. Examples of the electronic device 1000 may include a television set, a desktop computer, and the like, as well as a mobile device such as a smartphone, a tablet PC, a laptop computer and the like. Components such as the display 1010, the communications unit 1020, the memory 1030, the port 1040, and the processor 1050 may communicate with each other via a bus 1060.

The memory 1030 may receive a command transmitted by the processor 1050 via the bus 1060, to perform operations such as programming, reading, erasing operations, and the like. An example of the memory 1030 may include a NAND-type flash memory device, and may include any one of the memory devices according to various example embodiments described above with reference to FIGS. 1 to 12.

For the controller described above, one or more outputs may take various forms. For example, when the controller is embodied within an integrated circuit chip, the one or more outputs may be one or more output terminals, leads, wires, ports, signal lines, and/or other type of interface without or coupled to the controller.

The controllers and other processing features of the embodiments described herein may be implemented in logic, which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

As set forth above, according to an example embodiment, during performing an operation of reading data stored in a memory cell, a voltage greater than a pass voltage may be input to at least a portion of a gate electrode layer. Thus, occurrence of a defect, occurring due to holes accumulated in a charge storage layer of a dummy memory cell in which an erasing operation is only performed without a programming operation, may be prevented, and memory device reliability may be improved. In particular, a method of compensating for a change in a threshold voltage of a string select transistor SST or the like due to accumulated holes, without securing a separate operation cycle, is disclosed in accordance with one or more embodiments. In the operation of reading data of any one of memory cells, e.g., in a reading operation, a program verifying operation, an erase verifying operation, or the like, a soft program voltage causing a soft program phenomenon may be input to a string select transistor, having been sensed as having a varied threshold voltage. Electrons may be trapped in a charge storage layer of the string select transistor by the soft program voltage, thereby removing holes moved from a dummy memory cell. The compensation voltage, e.g., a soft program voltage may be input to the dummy memory cell and the like, in addition to the string select transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
a memory cell array including a plurality of word lines, a first string select line above the plurality of word lines, and a second string select line between the first string select line and the plurality of word lines; and
a controller, during an operation of reading data of a first memory cell connected to a first word line among the plurality of word lines, to supply a first voltage to the first string select line and to supply a second voltage to the second string select line, the second voltage being greater than the first voltage, wherein the first string select line and the second string select line share a single channel region with the first word line.

2. The memory device as claimed in claim 1, wherein the operation includes a reading operation of reading data stored in the first memory cell, an erase verifying operation of verifying whether the first memory cell is erased, and a program verifying operation of reading and verifying data programmed in the first memory cell.

3. The memory device as claimed in claim 1, wherein the controller is to supply a first word line voltage to a first word line of the plurality of word lines and to supply a second word line voltage greater than the first word line voltage to second word lines different from the first word line among the plurality of word lines.

4. The memory device as claimed in claim 3, wherein the controller is to supply the second word line voltage to the first string select line and to supply a third voltage greater than the second word line voltage to the second string select line.

5. The memory device as claimed in claim 3, wherein the first word line and the second word lines share a single channel region.

6. The memory device as claimed in claim 1, wherein the memory cell array includes:
a first ground select line below the plurality of word lines, and
a second ground select line between the plurality of word lines and the first ground select line.

7. The memory device as claimed in claim 6, wherein, while reading the data of the first memory cell is performed, the controller is to:
supply a first ground select line voltage to the first ground select line; and
supply a second ground select line voltage, greater than the first ground select line voltage, to the second ground select line.

8. The memory device as claimed in claim 6, wherein a threshold voltage of a first ground select transistor connected to the first ground select line is greater than a threshold voltage of a second ground select transistor connected to the second ground select line.

9. The memory device as claimed in claim 1, wherein a threshold voltage of a first string select transistor connected to the first string select line is greater than a threshold voltage of a second string select transistor connected to the second string select line.

10. The memory device as claimed in claim 1, wherein the memory cell array includes:
an upper dummy word line between the plurality of word lines and the second string select line; and
a lower dummy word line below the plurality of word lines.

11. The memory device as claimed in claim 10, wherein, during erase verifying of the first memory cell, the controller is to supply a first dummy voltage, greater than the first voltage, to at least one of the upper dummy word line and the lower dummy word line.

12. The memory device as claimed in claim 11, wherein the first dummy voltage is less than or equal to the second voltage.

13. The memory device as claimed in claim 11, wherein the controller is to supply the first dummy voltage to the upper dummy word line and to supply a second dummy voltage to the lower dummy word line, the second dummy voltage being less than or equal to the first dummy voltage.

14. The memory device as claimed in claim 1, wherein the plurality of word lines includes:
    a plurality of lower word lines sharing a lower channel region, and
    a plurality of upper word lines sharing an upper channel region connected to an upper portion of the lower channel region, and wherein the memory device further includes:
    an intermediate dummy word line between the plurality of lower word lines and the plurality of upper word lines.

15. The memory device as claimed in claim 14, wherein, while during reading the data of the first memory cell connected to any one of the plurality of lower word lines, the controller is to supply a third dummy voltage, greater than the first voltage, to the intermediate dummy word line.

16. A memory device, comprising:
    a plurality of memory cells arranged in a direction perpendicular to an upper surface of a substrate;
    at least one ground select transistor connected between the plurality of memory cells and the substrate;
    a first string select transistor connected to a bit line above the plurality of memory cells;
    a second string select transistor connected between the plurality of memory cells and the first string select transistor, in a direction perpendicular to the upper surface of the substrate; and
    a controller to supply a first compensation voltage to at least one of the first string selector transistor, the second string select transistor, and the at least one ground select transistor, to adjust a threshold voltage thereof, while reading data of at least one of the plurality of memory cells.

17. The memory device as claimed in claim 16, further comprising:
    an upper dummy memory cell between the plurality of memory cells and the second string select transistor; and
    a lower dummy memory cell between the plurality of memory cells and the at least one ground select transistor.

18. The memory device as claimed in claim 17, wherein, while reading data of at least one of the plurality of memory cells, the controller is to:
    supply a second compensation voltage less than or equal to the first compensation voltage to the upper dummy memory cell, and
    supply a third compensation voltage less than or equal to the second compensation voltage to the lower dummy memory cell.

19. A memory device, comprising:
    an upper memory region including a plurality of upper memory cells connected to each other in a direction perpendicular to an upper surface of a substrate, and upper dummy memory cells above the plurality of upper memory cells;
    a lower memory region including a plurality of lower memory cells sharing a channel region together with the plurality of upper memory cells; and
    an intermediate dummy memory cell between the plurality of lower memory cells and the plurality of upper memory cells, wherein
    while reading data of at least one of the plurality of upper memory cells, a compensation voltage input to the upper dummy memory cell is greater than a compensation voltage input to the intermediate dummy memory cell, and
    while reading data of at least one of the plurality of lower memory cells, a compensation voltage input to the upper dummy memory cell is lower than a compensation voltage input to the intermediate dummy memory cell.

20. The memory device as claimed in claim 19, further comprising:
    a first string select transistor above the upper dummy memory cell, and
    a second string select transistor between the upper dummy memory cell and the first string select transistor,
    wherein, while reading data of at least one of the plurality of upper memory cells and the plurality of lower memory cells, a compensation voltage input to the second string select transistor is greater than a compensation voltage input to the first string select transistor.

* * * * *